(12) United States Patent
Han et al.

(10) Patent No.: US 12,709,709 B2
(45) Date of Patent: Aug. 18, 2026

(54) METHOD OF PREPARING QUANTUM DOT, OPTICAL MEMBER INCLUDING THE QUANTUM DOT PREPARED USING THE METHOD, AND ELECTRONIC DEVICE INCLUDING THE QUANTUM DOT

(71) Applicant: Samsung Display Co., Ltd., Yongin-si (KR)

(72) Inventors: Changyeol Han, Yongin-si (KR); Yunhyuk Ko, Yongin-si (KR); Yunku Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 472 days.

(21) Appl. No.: 18/132,896

(22) Filed: Apr. 10, 2023

(65) Prior Publication Data

US 2023/0323203 A1 Oct. 12, 2023

(30) Foreign Application Priority Data

Apr. 11, 2022 (KR) ........................ 10-2022-0044758

(51) Int. Cl.
*C09K 11/88* (2006.01)
*B82Y 20/00* (2011.01)
(Continued)

(52) U.S. Cl.
CPC ....... *C09K 11/883* (2013.01); *H10H 20/8512* (2025.01); *B82Y 20/00* (2013.01); *B82Y 40/00* (2013.01)

(58) Field of Classification Search
CPC ..... C09K 11/883; C09K 11/025; C09K 11/02; C09K 11/892; C09K 11/565;
(Continued)

(56) References Cited

U.S. PATENT DOCUMENTS 10,510,922 B2 12/2019 Peng et al.
2018/0301592 A1* 10/2018 Peng .................... C09K 11/883
(Continued)

FOREIGN PATENT DOCUMENTS

EP 3607025 B1 10/2020
KR 10-2019-0106823 A 9/2019
(Continued)

OTHER PUBLICATIONS

Han Chang-Yeol et al., "Over 9% Efficient ZnSeTe Quantum Dot-Based Blue Electroluminescent Devices", ACS Energy Lett. (2020) 5, 1568-1576 (30 pages).
(Continued)

*Primary Examiner* — Jonathan Han
(74) *Attorney, Agent, or Firm* — Womble Bond Dickinson (US) LLP

(57) ABSTRACT

A method of preparing a quantum dot, an optical member including the quantum dot prepared using the method, and an electronic device including the quantum dot are provided. The method includes forming a first particle including a core and a protective shell from a quantum dot composition including a precursor containing a tellurium (Te) element, a precursor containing a Group II element, and a precursor containing a Group VI element; purifying the first particle; and forming a second particle including a first shell by mixing the first particle with a first shell composition including the precursor containing a Group II element and the precursor containing a Group VI element and forming the first shell from the protective shell.

20 Claims, 3 Drawing Sheets

(51) Int. Cl.
*B82Y 40/00* (2011.01)
*H10H 20/851* (2025.01)

(58) Field of Classification Search
CPC .... H10H 20/8512; B82Y 20/00; B82Y 40/00; B82Y 30/00; G02B 5/20
See application file for complete search history.

(56) References Cited

U.S. PATENT DOCUMENTS

| | | | | |
|---|---|---|---|---|
| 2019/0276737 | A1* | 9/2019 | Won | C09K 11/883 |
| 2020/0119298 | A1* | 4/2020 | Kim | H10K 50/115 |

FOREIGN PATENT DOCUMENTS

| | | | |
|---|---|---|---|
| KR | 10-2181061 | B1 | 11/2020 |
| WO | WO 2018/188604 | A1 | 10/2018 |

OTHER PUBLICATIONS

Jang, Eun-Pyo et al., "Synthesis of Alloyed ZnSeTe Quantum Dots as Bright, Color-Pure Blue Emitters",ACS Appl. Mater. Interfaces (2019) 11, 46062-46069 (27 pages).

* cited by examiner

200A 230
220
210

10A

| 190 |
|---|
| 170 |
| 150 |
| 130 |
| 110 |

Comparative Example 1
ZnSeTe core
~5.5 nm

Comparative Example 2
ZnSeTe/thin-ZnSe
~6.9 nm

Example 1
ZnSeTe/ZnSe/ZnS
~11 nm

METHOD OF PREPARING QUANTUM DOT, OPTICAL MEMBER INCLUDING THE QUANTUM DOT PREPARED USING THE METHOD, AND ELECTRONIC DEVICE INCLUDING THE QUANTUM DOT

CROSS-REFERENCE TO RELATED APPLICATION

This application claims priority to and the benefit of Korean Patent Application No. 10-2022-0044758, filed on Apr. 11, 2022, in the Korean Intellectual Property Office, the entire content of which is hereby incorporated by reference.

BACKGROUND

1. Field

Aspects of one or more embodiments of the present disclosure relate to a method of preparing a quantum dot, an optical member including the quantum dot, and an electronic device including the quantum dot.

2. Description of the Related Art

In optical members and/or in one or more suitable electronic devices, quantum dots may be utilized for one or more suitable optical functions, such as a light conversion function or a light emission function. Quantum dots are nanometer-sized semiconductor crystals that exhibit a quantum confinement effect, and may have different energy band gaps by controlling the size and composition of the nanocrystals. Thus, quantum dots enable one to control the emission of light at one or more suitable emission wavelengths.

An optical member including such quantum dots may have (e.g., arranged in) the form of a thin film, such as a thin film patterned for each sub-pixel. Such an optical member may also be utilized as a color conversion member of a device that includes one or more suitable light sources.

Quantum dots may be utilized for one or more suitable purposes in one or more suitable electronic devices. For example, quantum dots may also be utilized as an emitter. To serve as an emitter, quantum dots may be included in an emission layer of a light-emitting element including a pair of electrodes and an emission layer.

In order to implement a high-quality optical member and electronic device, it is necessary to develop quantum dots that emit blue light having a maximum emission wavelength equal to or less than about 490 nm, have an excellent or suitable photoluminescence quantum yield (PLQY), and do not contain cadmium, which is a toxic element.

SUMMARY

An aspect of one or more embodiments of the present disclosure is directed toward a method of preparing a quantum dot and an electronic device including a quantum dot prepared utilizing the method.

Additional aspects will be set forth in part in the description which follows and, in part, will be apparent from the description, or may be learned by practice of the presented embodiments of the disclosure.

According to one or more embodiments of the present disclosure, a method of preparing a quantum dot includes forming a first particle including a core and a protective shell from a quantum dot composition including a precursor containing a tellurium (Te) element, a precursor containing a Group II element, and a precursor containing a Group VI element, purifying the first particle, and forming a second particle including a first shell by mixing a first shell composition including the first particle and the precursor containing a Group II element and the precursor containing a Group VI element and forming the first shell from the protective shell.

According to one or more embodiments of the present disclosure, an electronic device includes a quantum dot prepared utilizing the method of preparing a quantum dot.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figures 1, 2:
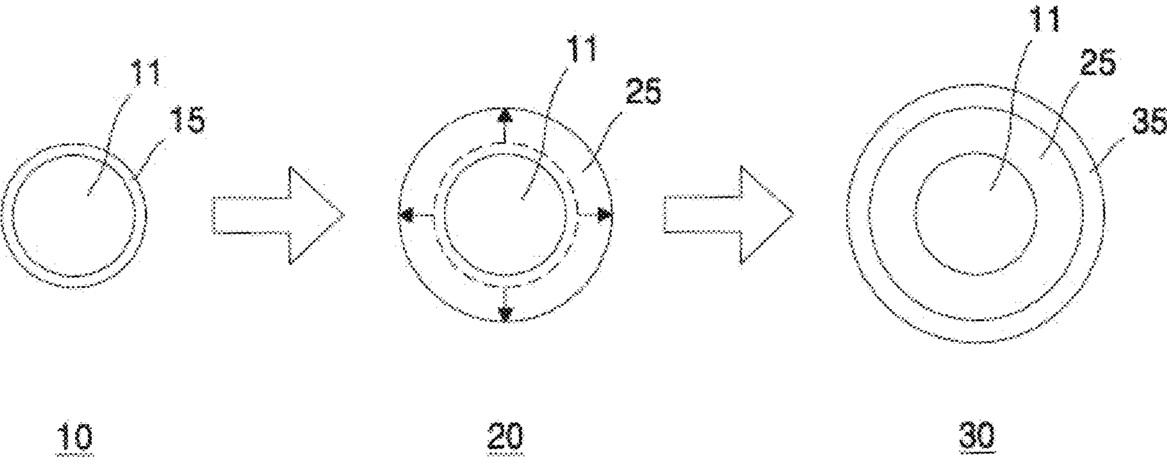
FIG. 1 is a schematic view of a method of preparing a quantum dot according to an embodiment.
FIG. 2 is a schematic view of a structure of an electronic device according to an embodiment.

Reference will now be made in more detail to embodiments, examples of which are illustrated in the accompanying drawings, wherein like reference numerals refer to like elements throughout, and duplicative descriptions thereof may not be provided. In this regard, the embodiments of the present disclosure may have different forms and should not be construed as being limited to the descriptions set forth herein. Accordingly, the embodiments are merely described, by referring to the drawings, to explain aspects of the present disclosure. As utilized herein, the term “and/or” includes any and all combinations of one or more of the associated listed items. Throughout the disclosure, the expression “at least one of a, b or c” indicates only a, only b, only c, both (e.g., simultaneously) a and b, both (e.g., simultaneously) a and c, both (e.g., simultaneously) b and c, all of a, b, and c, or variations thereof.

Because the subject matter of the disclosure may have diverse modified embodiments, only certain embodiments are illustrated in the drawings and are described in the detailed description. An effect and a characteristic of embodiments of the disclosure, and a method of accomplishing these will be apparent when referring to embodiments described with reference to the drawings. The disclosure may, however, be embodied in many different forms and should not be construed as limited to the embodiments set forth herein.

It will be understood that although the terms “first,” “second,” etc. may be utilized herein to describe one or more suitable components, these components should not be limited by these terms. These components are only utilized to distinguish one component from another.

As utilized herein, an expression utilized in the singular encompasses the expression of the plural, unless it has a clearly different meaning in the context.

As utilized herein, the terms "include," "comprise," or "have" refer to a corresponding component being present, and the possibility of adding one or more other components is not excluded. Unless defined otherwise, the terms "include," "comprise," or "have," as utilized herein, may refer to both (e.g., simultaneously) the embodiment of only consisting of the corresponding components and the embodiment of further including other components.

The term "Group II element," as utilized herein, may include a Group IIA element and/or a Group IIB element on the IUPAC periodic table, and the Group II element includes, for example, magnesium (Mg), calcium (Ca), zinc (Zn), cadmium (Cd), and/or mercury (Hg).

The term "Group III element," as utilized herein, may include a Group IIIA element and/or a Group IIIB element on the IUPAC periodic table, and the Group III element may include, for example, aluminum (Al), gallium (Ga), indium (In), and/or thallium (Tl).

The term "Group V element," as utilized herein, may include a Group VA element and/or a Group VB element on the IUPAC periodic table, and the Group V element may include, for example, nitrogen (N), phosphorus (P), arsenic (As), and/or antimony (Sb).

The term "Group VI element," as utilized herein, may include a Group VIA element and/or a Group VIB element on the IUPAC periodic table, and the Group VI element may include, for example, sulfur (S), selenium (Se), and/or tellurium (Te).

Hereinafter, a method of preparing a quantum dot 30 according to an embodiment will be described in reference to FIG. 1.

According to an embodiment, a method of preparing a quantum dot 30 includes forming a first particle 10 including a core 11 and a protective shell 15 from a quantum dot composition including a precursor containing a tellurium (Te) element, a precursor containing a Group II element, and a precursor containing a Group VI element; purifying the first particle 10; and forming a second particle 20 including a first shell 25 by mixing the first particle 10 with a first shell composition including the precursor containing a Group II element and the precursor containing a Group VI element and forming the first shell 25 from the protective shell 15.

In one embodiment, the forming of the first particle 10 may form a first particle 10 including a tellurium (Te) element, a Group II element, and a Group VI element and having a core/shall structure.

In one embodiment, a reaction temperature of the forming of the first particle 10 may be in a range of about 100° C. to about 400° C. For example, the forming of the first particle 10 may be performed at a temperature in a range of about 100° C. to about 400° C.

In some embodiments, a reaction temperature of the forming of the first particle 10 may be in a range of about 100° C. to about 350° C. For example, a thickness of the protective shell 15 may be controlled or selected by controlling a reaction temperature of the forming of the first particle 10.

In one embodiment, the forming of the first particle 10 may include forming a core 11 including a tellurium (Te) element; and forming a protective shell 15 not including a tellurium (Te) element. For example, the core 11 includes a Te element, the protective shell 15 does not include (e.g., may exclude) a Te element (e.g., not include any Te element), and thus oxidation of the core 11 may be effectively prevented or reduced.

In one embodiment, the forming of the protective shell 15 not including a Te element and the forming of the core 11 including a Te element may be performed at a temperature in a range of about 100° C. to about 400° C.

In some embodiments, the forming of the protective shell 15 not including a Te element and the forming of the core 11 including a Te element may be performed at a temperature in a range of about 100° C. to about 350° C.

In one embodiment, the forming of the protective shell 15 not including a Te element may be performed at a temperature in substantially the same range with that of the forming of the core 11 including a Te element.

In one embodiment, a thickness of the protective shell 15 may be in a range of about 0.3 nanometers (nm) to about 1 nm.

In some embodiments, a thickness of the protective shell 15 may be in a range of about 0.35 nm to about 0.95 nm.

In one embodiment, a radius of the core 11 may be in a range of about 0.1 nm to about 3.5 nm.

In one embodiment, the forming of the protective shell 15 not including a Te element may include further adding the precursor containing a Group II element and the precursor containing a Group VI element to the quantum dot composition.

For example, the forming of the protective shell 15 not including a Te element may include forming of the core 11 including a Te element from the quantum dot composition and further adding the precursor containing a Group II element and the precursor containing a Group VI element thereto. In this embodiment, the forming of the protective shell 15 not including a Te element may be performed at a temperature in substantially the same range as that of the forming of the core 11 including a Te element.

In one embodiment, the precursor containing a Group II element in the quantum dot composition may be identical to the precursor containing a Group II element that is further added to the quantum dot composition. In some embodiments, the precursor containing a Group II element in the quantum dot composition may be different from the precursor containing a Group II element that is further added to the quantum dot composition.

In one embodiment, the precursor containing a Group VI element in the quantum dot composition may be identical to the precursor containing a Group VI element that is further added to the quantum dot composition. In some embodiments, the precursor containing a Group VI element in the quantum dot composition may be different from the precursor containing a Group VI element that is further added to the quantum dot composition.

In one embodiment, a ratio of a mole number of the precursor containing a Group II element that is further added to the quantum dot composition to a mole number of the precursor containing a Group II element in the quantum dot composition may be in a range of about 0.1 to about 0.5.

In one embodiment, a ratio of a mole number of the precursor containing a Group VI element that is further added to the quantum dot composition to a mole number of the precursor containing a Group VI element in the quantum dot composition may be in a range of about 0.1 to about 0.5.

In one embodiment, the precursor containing a Group II element may include zinc or a zinc compound; cadmium or a cadmium compound; or mercury or a mercury compound.

In one embodiment, the precursor containing a Group II element may include zinc acetate, dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, cadmium oxide, dimethyl cadmium, diethyl cadmium, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, mercury iodide, mercury bromide, mercury fluoride, mercury cyanide, mercury nitrate, mercury perchlorate, mercury sulfate, mercury oxide, mercury carbonate, mercury carboxylate, or one or more combinations thereof.

In one embodiment, the precursor containing a Group II element may include zinc acetate, dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or one or more combinations thereof.

In one embodiment, the precursor containing a Group VI element may not include (e.g., may exclude) tellurium (Te) (e.g., not include any Te).

In one embodiment, the precursor containing a Group VI element may include sulfur or a sulfur compound; or selenium or a selenium compound.

In one embodiment, the precursor containing a Group VI element may include sulfur, trialkylphosphine sulfide, trialkenylphosphine sulfide, alkylamino sulfide, alkenylamino sulfide, alkylthiol, selenium, trialkylphosphine selenide, trialkenylphosphine selenide, alkylamino selenide, alkenylamino selenide; or one or more combinations thereof.

In some embodiments, the precursor containing a Group VI element may include a selenium composition prepared by dissolving selenium in diphenylphosphine.

In one embodiment, the precursor containing tellurium (Te) may include tellurium or a tellurium compound.

In one embodiment, the precursor containing tellurium (Te) may include tellurium, trialkylphosphine telluride, trialkenylphosphine telluride, alkylamino telluride, alkenylamino telluride, or one or more combinations thereof.

In one embodiment, the quantum dot composition may include a first solvent having a boiling point of about 350° C. or lower.

In some embodiments, the first solvent may include 1-octadecene.

In one embodiment, the core 11 and the protective shell 15 may each independently include a Group II-VI compound.

In some embodiments, the core 11 may include a Group II-VI compound containing tellurium (Te), and the protective shell 15 may include a Group II-VI compound not containing tellurium (Te).

In one embodiment, the core 11 may include CdSeTe, CdSTe, ZnSeTe, ZnSTe, HgSeTe, HgSTe, CdZnTe, CdHgTe, HgZnTe, or one or more combinations thereof.

In some embodiments, the core 11 may include $ZnSeixTe_{1-x}$ (wherein $0 \leq x \leq 1$). In one embodiment, the protective shell 15 may include CdS, CdSe, ZnS, ZnSe, ZnO, HgS, HgSe, MgSe, MgS, CdSeS, ZnSeS, HgSeS, CdZnS, CdZnSe, CdHgS, CdHgSe, HgZnS, HgZnSe, MgZnSe, MgZnS, CdZnSeS, CdHgSeS, HgZnSeS, or one or more combinations thereof.

In some embodiments, the protective shell 15 may include ZnS, ZnSe, or a combination thereof.

In one embodiment, the purifying of the first particle 10 may include removing an unreacted quantum dot composition.

For example, the purifying of the first particle 10 may include forming the first particle 10 from the quantum dot composition and then removing an unreacted quantum dot composition remaining after the forming of the first particle 10.

For example, in the removing of the unreacted quantum dot composition from the first particle 10, the first particle 10 may react with $O_2$ and $H_2O$ in the air. In this embodiment, an oxide film may be formed on a surface of the first particle 10.

In one embodiment, the purifying of the first particle 10 may further include removing the oxide film. For example, the purifying of the first particle 10 may further include removing the oxide film formed on the first particle 10 after removing the unreacted quantum dot composition.

In one embodiment, the removing of the oxide film may be performed by treating an oxide film removing agent to the first particle 10, from which the unreacted quantum dot composition is removed.

For example, the oxide film removing agent may include HF.

For example, a second particle 20 including a first shell 25 may be formed by mixing the first particle 10 with a first shell composition including the precursor containing a Group II element and the precursor containing a Group VI element and forming the first shell 25 from the protective shell 15.

For example, the second particle 20 not including a second shell 35, which will be described in more detail, may also be included in the quantum dot 30.

In one embodiment, the forming of the second particle 20 may include forming of the first shell 25 by increasing a thickness of the protective shell 15. For example, the first shell 25 may be formed as the thickness of the protective shell 15 is increased by reacting the first shell composition with the first particle 10. For example, the first shell 25 may indicate that a thickness of the protective shell 15 is relatively increased. For example, the first shell 25 may indicate that a thickness of the protective shell 15 is increased twice or more.

In one embodiment, a thickness of the first shell 25 may be greater than that of the protective shell 15.

In one embodiment, a thickness of the first shell 25 may be in a range of about 1.5 nm to about 3.5 nm. For example, as a thickness of the first shell 25 increases so that it is thicker than that of the protective shell 15, a photoluminescent (PL) spectrum full width at half maximum (FWHM) of the quantum dot 30 including the first shell 25 may be reduced. In this regard, a quantum yield (QY) of the quantum dot 30 may be improved (increased).

In some embodiments, a thickness of the first shell 25 may be in a range of about 2 nm to about 2.5 nm.

In one embodiment, a composition of the protective shell 15 may be identical to that of the first shell 25.

In one embodiment, the first shell 25 may include a Group II-VI compound.

For example, the Group II-VI compound in the first shell 25 may be identical to the Group II-VI compound in the protective shell 15.

In one embodiment, the first shell 25 may include CdS, CdSe, ZnS, ZnSe, ZnO, HgS, HgSe, MgSe, MgS, CdSeS, ZnSeS, HgSeS, CdZnS, CdZnSe, CdHgS, CdHgSe, HgZnS, HgZnSe, MgZnSe, MgZnS, CdZnSeS, CdHgSeS, HgZnSeS, or one or more combinations thereof.

In some embodiments, the first shell 25 may include ZnS, ZnSe, or a combination thereof.

In one embodiment, the forming of the second particle 20 including the first shell 25 may be performed at a temperature higher than that of the forming of the first particle 10 including the protective shell 15.

In some embodiments, the forming of the second particle 20 may be performed at a temperature in a range of about 200° C. to about 500° C.

For example, the forming of the second particle 20 may be performed at a temperature in a range of about 350° C. to about 400° C.

In one embodiment, the first shell composition may include a second solvent having a boiling point of about 350° C. or higher.

In some embodiments, the second solvent may include trioctyl amine.

In one embodiment, the method of preparing the quantum dot 30 may further include forming a second shell 130 by mixing the second particle 20 with a second shell composition including a precursor containing a Group II element and a precursor containing a Group VI.

In one embodiment, a reaction temperature of the forming of the second shell 35 may be in a range of about 100° C. to about 400° C.

In one embodiment, a thickness of the second shell 35 may be in a range of about 0.1 nm to about 10 nm.

In some embodiments, a thickness of the second shell 35 may be in a range of about 1 nm to about 10 nm.

In one embodiment, the second shell 35 may include a Group II-VI compound.

In some embodiments, the second shell 35 may include CdS, CdSe, ZnS, ZnSe, ZnO, HgS, HgSe, MgSe, MgS, CdSeS, ZnSeS, HgSeS, CdZnS, CdZnSe, CdHgS, CdHgSe, HgZnS, HgZnSe, MgZnSe, MgZnS, CdZnSeS, CdHgSeS, HgZnSeS, or one or more combinations thereof.

In some embodiments, the second shell 35 may include ZnS, ZnSe, or a combination thereof.

In one embodiment, a composition of the second shell 35 may be identical to that of the first shell 25.

In one embodiment, the first shell 25 may include ZnSe, and the second shell 35 may include ZnS.

In one embodiment, a maximum emission wavelength of the quantum dot 30 may be in a range of about 400 nm to about 490 nm.

In some embodiments, a maximum emission wavelength of the quantum dot 30 may be in a range of about 440 nm to about 470 nm.

In one embodiment, an average particle diameter (D50) of the quantum dot 30 may be in a range of about 5 nm to about 100 nm. In some embodiments, an average particle diameter (D50) of the quantum dot 30 may be in a range of about 7 nm to about 100 nm.

In one embodiment, a full width at half maximum (FWHM) of a photoluminescence (PL) spectrum of the quantum dot 30 may be in a range of about 20 nm to about 60 nm, for example, about 20 nm to about 45 nm, about 20 nm to about 43 nm, about 20 nm to about 40 nm, or about 20 nm to about 30 nm. When the FWHM of the quantum dot 30 is within these ranges, color purity and color reproducibility of an image produced utilizing the quantum dot 30 may be improved. In some embodiments, because light emitted through such quantum dots 30 is emitted in all directions, a wide viewing angle may be improved (increased).

In one embodiment, a quantum yield (QY) of the quantum dot 30 may be about 50% or greater. In some embodiments, a quantum yield (QY) of the quantum dot 30 may be about 55% or greater.

In one embodiment, a shape of the quantum dot is not limited, and the quantum dot may have a shape generally utilized in the related art. For example, the quantum dot may be in a substantially spherical form, a pyramidal form, a multi-armed form, and/or may be a cubic nanoparticle, a nanotube, a nanowire, a nanofiber, or a nano-plate particle.

When a quantum dot is prepared utilizing the method of preparing a quantum dot, oxidation of the core 11 may be effectively prevented or reduced in the process of the purifying of the first particle 10, and thus quality and lifespan of the quantum dot may be improved. And when a quantum dot is prepared utilizing the method of preparing a quantum dot, the quantum dot 30 including a thick first shell 25 may be easily prepared.

In this regard, the quantum dot may have a reduced FWHM and an improved quantum yield. Therefore, when the quantum dot is included, an optical member and an electronic device of high quality having improved lifespan characteristics may be manufactured.

In one embodiment, the quantum dot 30 may further include compounds other than those of the above-described compositions.

For example, the quantum dot 30 may further include a Group II-VI compound, a Group III-VI compound, a Group III-VI compound, a Group IV-VI compound, a Group IV element or compound, a Group I-III-VI compound, or one or more combinations thereof in the core 11, the first shell 25, and the second shell 35.

The Group II-VI compound may be selected from the group including (e.g., consisting of): a binary compound selected from the group including (e.g., consisting of) CdS, CdSe, CdTe, ZnS, ZnSe, ZnTe, ZnO, HgS, HgSe, HgTe, MgSe, MgS, and one or more compounds or mixtures thereof; a ternary compound selected from the group including (e.g., consisting of) CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and one or more compounds or mixtures thereof; and a quaternary compound selected from the group including (e.g., consisting of) CdZnSeS, CdZnSeTe, CdZnSTe, CdHgSeS, CdHgSeTe, CdHgSTe, HgZnSeS, HgZnSeTe, HgZnSTe, and one or more compounds or mixtures thereof.

The Group III-VI compound may include a binary compound such as $In_2S_3$ or $In_2Se_3$; a ternary compound such as $InGaS_3$ or $InGaSe_3$; or one or more combinations thereof.

The Group III-V compound may be selected from the group including (e.g., consisting of): a binary compound selected from the group including (e.g., consisting of) GaN, GaP, GaAs, GaSb, AlN, AlP, AlAs, AlSb, InN, InP, InAs, InSb, and one or more compounds or mixtures thereof; a ternary compound selected from the group including (e.g., consisting of) GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and one or more compounds or mixtures thereof; and a quaternary compound selected from the group including (e.g., consisting of) GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and one or more compounds or mixtures thereof. The Group III-V semiconductor compound may further include a Group II metal (e.g., InZnP).

The Group IV-VI compound may be selected from the group including (e.g., consisting of): a binary compound selected from the group including (e.g., consisting of) SnS, SnSe, SnTe, PbS, PbSe, PbTe, and one or more compounds or mixtures thereof; a ternary compound selected from the group including (e.g., consisting of) SnSeS, SnSeTe, SnSTe, PbSeS, PbSeTe, PbSTe, SnPbS, SnPbSe, SnPbTe, and one or more compounds or mixtures thereof; and a quaternary compound selected from the group including (e.g., consisting of) SnPbSSe, SnPbSeTe, SnPbSTe, and one or more compounds or mixtures thereof. The Group IV element may be selected from the group including (e.g., consisting of) Si, Ge, and one or more elements or mixtures thereof. The Group IV compound may be a binary compound selected from the group including (e.g., consisting of) SiC, SiGe, and one or more compounds or mixtures thereof.

The Group I-III-VI semiconductor compound may include a ternary compound such as AgInS, $AgInS_2$, CuInS, $CuInS_2$, $CuGaO_2$, $AgGaO_2$, $AgAlO_2$; or one or more combinations thereof.

In this embodiment, the binary compound, the ternary compound, or the quaternary compound may exist in a particle form at a substantially uniform concentration, or may exist in substantially the same particle form divided into states in which concentration distributions are partially different, i.e. the particle may be heterogeneous in its composition.

In one embodiment, the first shell 25 or the second shell 35 may further include a metal oxide or a non-metal oxide, a semiconductor compound, or one or more combinations thereof.

For example, the metal oxide or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; or a ternary compound such as $MgAl_2O_4$, $CoFe_2O_4$, $NiFe_2O_4$, or $CoMn_2O_4$.

Also, for example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

Optical Member

The quantum dot 30 may be utilized in one or more suitable optical members. Thus, according to another aspect of one or more embodiments of the present disclosure, an optical member including the quantum dot is provided.

In one embodiment, the optical member may be a light control.

In some embodiments, the optical member may be a color filter, a color conversion member, a capping layer, a light extraction efficiency improvement layer, a selective light absorption layer, or a polarization layer.

For example, the optical member may be a color conversion member.

Electronic Device

The quantum dot may be utilized in one or more suitable electronic devices. Thus, according to another aspect of one or more embodiments of the present disclosure, an electronic device including the quantum dot is provided.

According to an embodiment, provided is an electronic device including a light source; and a color conversion member disposed in a path of light emitted from the light source, wherein the color conversion member includes the quantum dot.

FIG. 2 is a schematic view illustrating a structure of an electronic device 200A according to an embodiment. The electronic device 200A of FIG. 2 includes a substrate 210; a light source 220 on the substrate; and a color conversion member 230 on the light source 220.

For example, the light source 220 may be a back light unit (BLU) utilized in a liquid crystal display (LCD), a fluorescent lamp, a light emitting diode, an organic light emitting diode, or a quantum dot light emitting diode (QLED), or one or more combinations thereof. The color conversion member 230 may be disposed on at least one travel direction of light emitted from the light source 220.

At least one area of the color conversion member 230 of the electronic device 200A includes the quantum dot, and the area absorbs light emitted from the light source 220 to emit blue light having a maximum emission wavelength in the range of about 510 nm to about 540 nm.

The fact that the color conversion member 230 is disposed on at least one travel direction of light emitted from the light source 220 does not exclude an embodiment in which other elements are further included between the color conversion member 230 and the light source 220.

For example, a polarizing plate, a liquid crystal layer, a light guide plate, a diffusing plate, a prism sheet, a microlens sheet, a luminance enhancing sheet, a reflective film, a color filter, or one or more combinations thereof may be additionally disposed between the light source 220 and the color conversion member 230.

As another example, a polarizing plate, a liquid crystal layer, a light guide plate, a diffusing plate, a prism sheet, a microlens sheet, a luminance enhancing sheet, a reflective film, a color filter, or one or more combinations thereof may be additionally disposed on the color conversion member 230.

The electronic device 200A shown in FIG. 2 is an example of the device according to the embodiment, may have one or more suitable forms, and may additionally include one or more suitable configurations for this purpose.

In some embodiments, the electronic device may have a structure in which a light source, a light guide plate, a color conversion member, a first polarizing plate, a liquid crystal layer, a color filter, and a second polarizing plate are sequentially arranged (in the stated order).

In some embodiments, the electronic device may have a structure in which a light source, a light guide plate, a first polarizing plate, a liquid crystal layer, a second polarizing plate, and a color conversion member sequentially arranged (in the stated order).

In the above embodiments, the color filter may include a pigment and/or dye. In the above embodiments, any one selected from among the first polarizing plate and the second polarizing plate may be a vertical polarizing plate, and the other (the one that is not selected) thereof may be a horizontal polarizing plate.

The quantum dot as described in this disclosure may be utilized as an emitter. Thus, according to another embodiment, there is provided an electronic device including a light-emitting element including a first electrode; a second electrode facing the first electrode; and an emission layer between the first electrode and the second electrode, wherein the light-emitting element may include the quantum dot. For example, the emission layer of the light-emitting element may include the quantum dot. The light-emitting element may further include a hole transport region between the first electrode and the emission layer, an electron transport region between the emission layer and the second electrode, or a combination thereof.

Figures 3, 4:
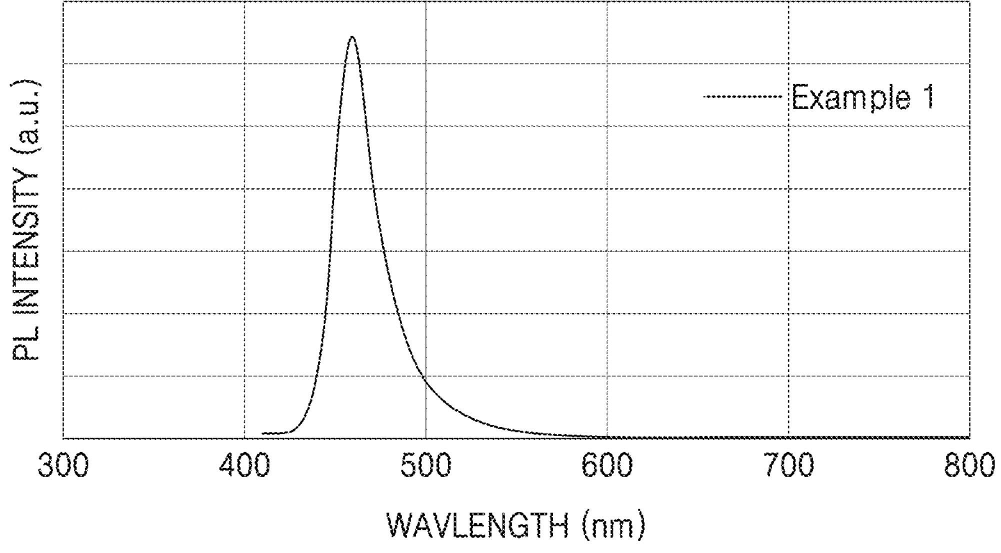
FIG. 3 is a schematic view of a structure of an electronic device according to another embodiment.
FIG. 4 shows a photoluminescent (PL) spectrum of a quantum dot prepared in Example 1 according to an embodiment of the present disclosure.

FIG. 3 is a schematic view illustrating a structure of a light-emitting element 10A according to an embodiment.

The light-emitting element 10A includes a first electrode 110; a second electrode 190 facing the first electrode 110; an emission layer 150 between the first electrode 110 and the second electrode 190 and including quantum dots; a hole transport region 130 between the first electrode 110 and the emission layer 150; and an electron transport region 170 between the emission layer 150 and the second electrode 190. Hereinafter, each layer of the light-emitting element 10A will be described in more detail.

First Electrode 110

In FIG. 3, a substrate may be additionally disposed under the first electrode 110 or on the second electrode 190. For the substrate, a glass substrate or a plastic substrate having excellent or suitable mechanical strength, thermal stability, transparency, surface smoothness, handling easiness, and water resistance may be utilized.

For example, in the embodiment of a top emission type or kind in which light from the light-emitting element 10A is emitted in a direction opposite to the substrate, the substrate need not be transparent, and may be opaque or translucent. For example, the substrate may be formed of a metal. When the substrate is formed of a metal, the substrate may include carbon, iron, chromium, manganese, nickel, titanium, molybdenum, stainless steel (SUS), an Invar® alloy, an Inconel® alloy, a Kovar® alloy, or one or more combinations thereof.

Further, a buffer layer, a thin film transistor, and an organic insulating layer may be provided between the substrate and the first electrode 110.

The first electrode 110 may be formed, for example, by providing a material for a first electrode on the substrate utilizing a deposition method or a sputtering method. The first electrode 110 may be a reflective electrode, a transflective electrode, or a transmissive electrode. In order to form the first electrode 110 as a transmissive electrode, the material for the first electrode may include indium tin oxide (ITO), indium zinc oxide (IZO), tin oxide ($SnO_2$), zinc oxide (ZnO), gallium zinc oxide (GZO), aluminum zinc oxide (AZO), $InZnSnO_x$ (IZSO), $ZnSnO_x$ (ZSO), graphene, PEDOT:PSS, carbon nanotubes, silver nanowires (Ag nanowires), gold nanowires (Au nanowires), metal mesh, or one or more combinations thereof. In an embodiment, in order to form the first electrode 110 as a reflective electrode or a transflective electrode, the material for the first electrode may include magnesium (Mg), silver (Ag), aluminum (Al), aluminum-lithium (Al—Li), calcium (Ca), magnesium-indium (Mg—In), magnesium-silver (Mg—Ag), or one or more combinations thereof.

The first electrode 110 may have a single-layer structure or a multi-layer structure having multiple layers. For example, the first electrode 110 may have a three-layer structure of ITO/Ag/ITO.

Hole Transport Region 130

The hole transport region 130 may have i) a single-layer structure including (e.g., consisting of) a single layer including a single material, ii) a single-layer structure including (e.g., consisting of) a single layer including materials different from each other, or iii) a multi-layer structure including (e.g., consisting of) multiple layers including different materials.

The hole transport region 130 may include a hole injection layer, a hole transport layer, an emission auxiliary layer, an electron blocking layer, or one or more combinations thereof.

For example, the hole transport region 130 may have a single-layer structure including (e.g., consisting of) a single layer including materials different from each other, or may have a multi-layer structure of a hole injection layer/hole transport layer, a hole injection layer/hole transport layer/emission auxiliary layer, a hole injection layer/emission auxiliary layer, a hole transport layer/emission auxiliary layer, or a hole injection layer/hole transport layer/electron blocking layer, which may be sequentially stacked from the first electrode 110 (in the stated order).

The hole transport region 130 may include an amorphous inorganic or organic material. The inorganic material may include NiO, $MoO_3$, $Cr_2O_3$, or $Bi_2O_3$. Also, the inorganic material may include a p-type or kind inorganic semiconductor in which an iodide, bromide, or chloride of Cu, Ag, or Au is doped with a non-metal such as O, S, Se, or Te, a p-type or kind inorganic semiconductor in which a compound containing Zn is doped with a metal such as Cu, Ag, or Au or with a non-metal such as N, P, As, Sb, or Bi, or a voluntary p-type or kind inorganic semiconductor such as ZnTe.

The organic material may include m-MTDATA, TDATA, 2-TNATA, NPB(NPD), β-NPB, TPD, Spiro-TPD, Spiro-NPB, methylated-NPB, TAPC, HMTPD, TCTA(4,4',4"-tris (N-carbazolyl)triphenylamine), Pani/DBSA (Polyaniline/Dodecylbenzenesulfonic acid), PEDOT/PSS(Poly(3,4-ethylenedioxythiophene)/Poly(4-styrenesulfonate)), Pani/CSA (Polyaniline/Camphor sulfonic acid), PANI/PSS (Polyaniline/Poly(4-styrenesulfonate)), PVK (Polyvinylcarbazole), a compound represented by Formula 201, a compound represented by Formula 202, or one or more combinations thereof:

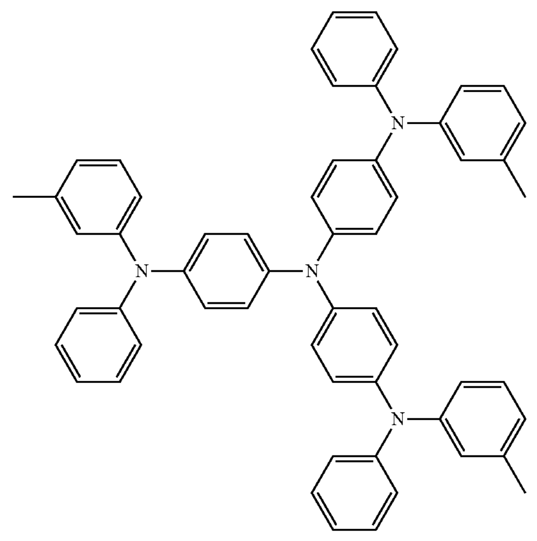

m-MTDATA

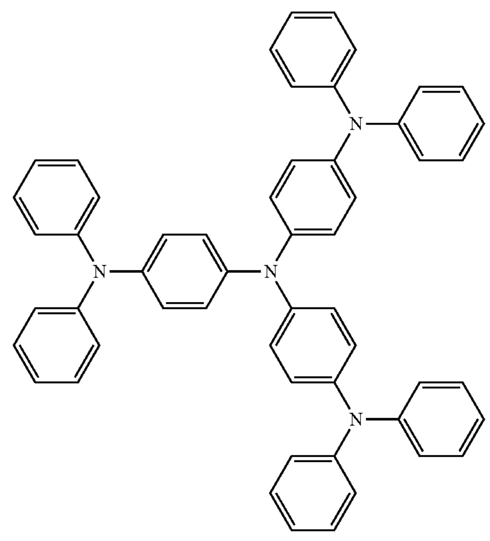

TDATA

-continued
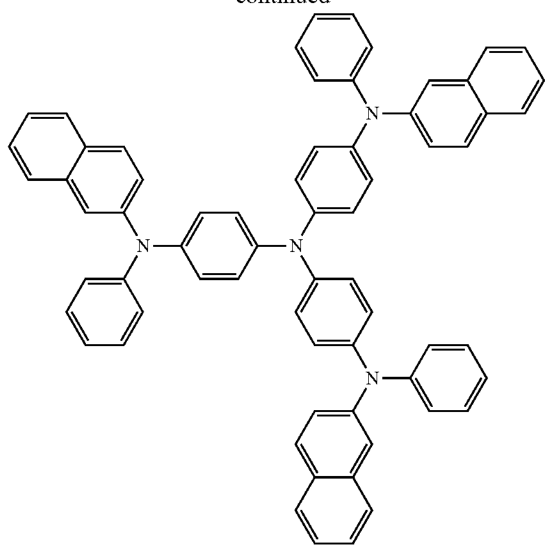
2-TNATA
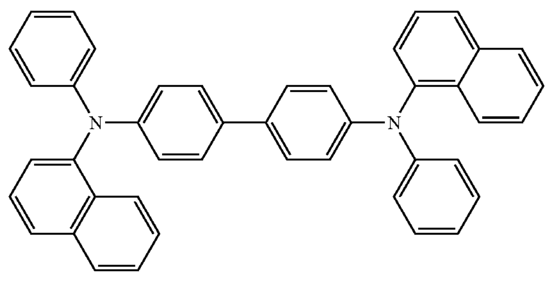
NPB
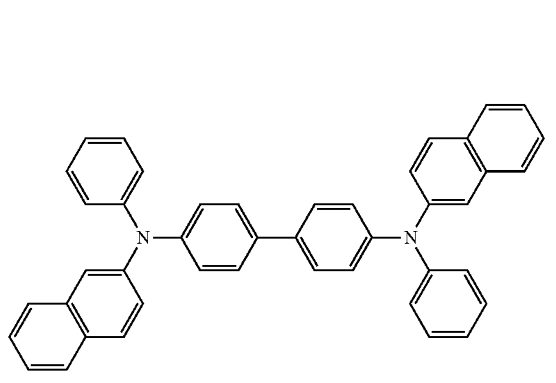
β-NPB
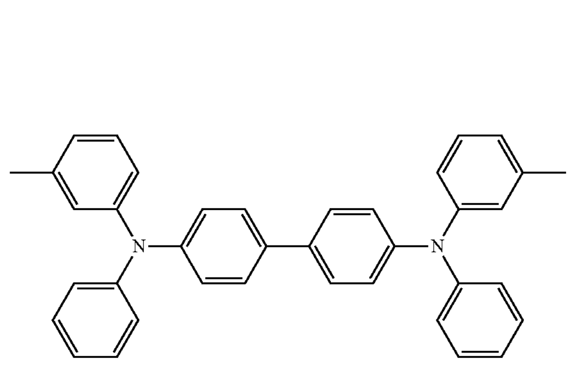
TPD
-continued
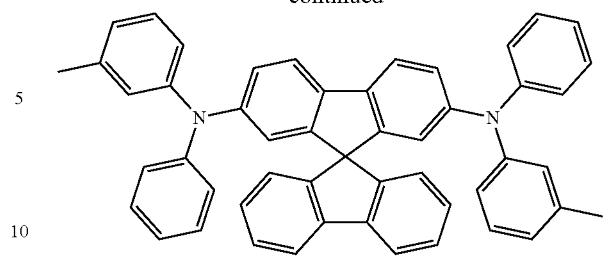
Spiro-TPD
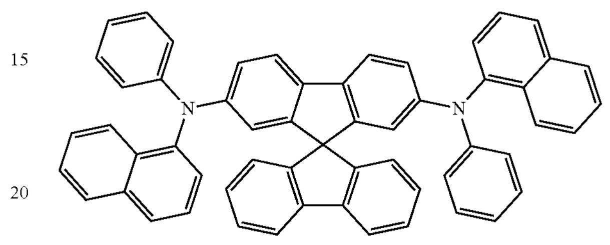
Spiro-NPB
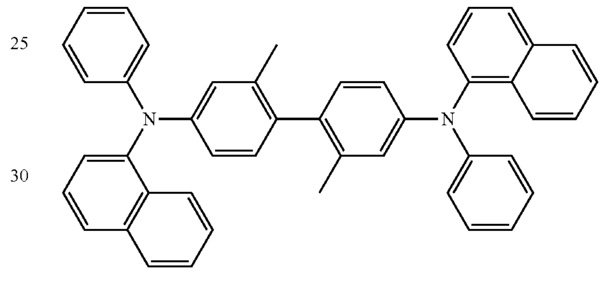
methylated-NPB
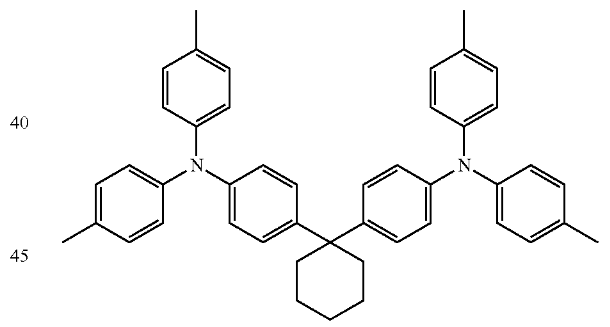
TAPC
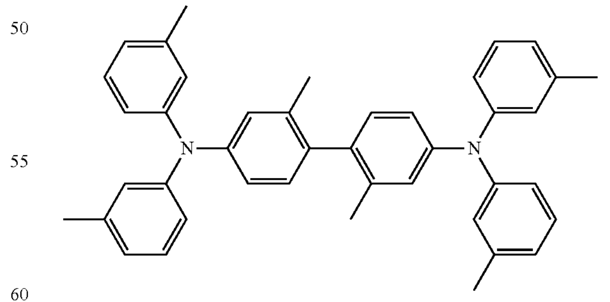
HMTPD
Formula 201
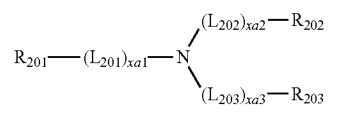

-continued

Formula 202

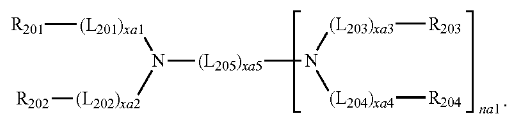

In Formulae 201 and 202, $L_{201}$ to $L_{204}$ may each independently be a $C_3$-$C_{60}$ carbocyclic group substituted or unsubstituted with at least one $R_{10a}$ or a $C_1$-$C_{60}$ heterocyclic group substituted or unsubstituted with at least one $R_{10a}$, $L_{205}$ may be *—O—*', *—S—*', *—N($Q_{201}$)-*', a $C_1$-$C_{20}$ alkylene group substituted or unsubstituted with at least one $R_{10a}$, a $C_2$-$C_{20}$ alkenylene group substituted or unsubstituted with at least one $R_{10a}$, a $C_3$-$C_{60}$ carbocyclic group substituted or unsubstituted with at least one $R_{10a}$, or a $C_1$-$C_{60}$ heterocyclic group substituted or unsubstituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group substituted or unsubstituted with at least one $R_{10a}$ or a $C_1$-$C_{60}$ heterocyclic group substituted or unsubstituted with at least one $R_{10a}$, $R_{201}$ and $R_{202}$ may be optionally connected to each other through a single bond, a $C_1$-$C_5$ alkylene group substituted or unsubstituted with at least one $R_{10a}$, or a $C_2$-$C_5$ alkenylene group substituted or unsubstituted with at least one $R_{10a}$ to form a $C_8$-$C_{60}$ polycyclic group substituted or unsubstituted with at least one $R_{10a}$ (e.g., a carbazol group), $R_{203}$ and $R_{204}$ may be optionally connected to each other through a single bond, a $C_1$-$C_5$ alkylene group substituted or unsubstituted with at least one $R_{10a}$, or a $C_2$-$C_5$ alkenylene group substituted or unsubstituted with at least one $R_{10a}$ to form a $C_8$-$C_{60}$ polycyclic group substituted or unsubstituted with at least one $R_{10a}$, and na1 may be an integer from 1 to 4.

A thickness of the hole transport region 130 may be in a range of about 50 Å to about 10000 Å or, for example, about 100 Å to about 4000 Å. When the hole transport area 130 includes a hole injection layer, a hole transport layer, or a combination thereof, a thickness of the hole injection layer may be in a range of about 100 Å to about 9000 Å or, for example, about 100 Å to about 1000 Å, and a thickness of the hole transport layer may be in a range of about 50 Å to about 2000 Å or, for example, about 100 Å to about 1500 Å. When the thicknesses of the hole transport region 130, the hole injection layer, and the hole transport layer are within the above ranges, respectively, satisfactory (suitable) hole transport characteristics may be obtained without a substantial increase in driving voltage.

The emission auxiliary layer is a layer that serves to increase light emission efficiency by compensating for an optical resonance distance according to the wavelength of light emitted from the emission layer, and the electron blocking layer is a layer that serves to prevent or reduce the leakage of electrons from the emission layer to the hole transport region 130. Materials that may be included in the above-described hole transport region 130 may be included in the emission auxiliary layer and/or the electron blocking layer.

P-Dopant

The hole transport region 130 may include a charge-generating material in addition to the above-described materials in order to improve conductivity. The charge-generating material may be substantially uniformly or non-uniformly dispersed in the hole transport region 130 (for example, in the form of a single layer including (e.g., consisting of) a charge-generating material).

The charge-generating material may be, for example, a p-dopant.

For example, the p-dopant may have a lowest unoccupied molecular orbital (LUMO) energy level of about −3.5 eV or less.

In one embodiment, the p-dopant may include a quinone derivative, a cyano group-containing compound, an element EL1 and element EL2-containing compound, or one or more combinations thereof.

Examples of the quinone derivative may include TCNQ and F4-TCNQ.

Examples of the cyano group-containing compound may include HAT-CN and/or a compound represented by Formula 221.

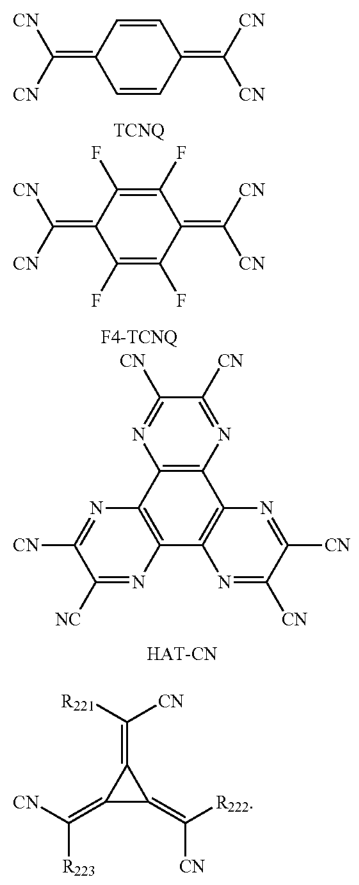

TCNQ

F4-TCNQ

HAT-CN

Formula 221

In Formula 221, $R_{221}$ to $R_{223}$ may each independently be a $C_3$-$C_{60}$ carbocyclic group substituted or unsubstituted with at least one $R_{10a}$ or a $C_1$-$C_{60}$ heterocyclic group substituted or unsubstituted with at least one $R_{10a}$, at least one of $R_{221}$ to $R_{223}$ may each independently be a cyano group; —F; —$C_1$; —Br; —I; a $C_1$-$C_{20}$ alkyl group substituted with a cyano group, —F, —Cl, —Br, —I, or one or more combinations thereof; or a $C_3$-$C_{60}$ carbocyclic group or $C_1$-$C_{60}$ heterocyclic group substituted with one or more combinations thereof.

In the element EU and element EL2-containing compound, the element EL1 may be a metal, a metalloid, or a combination thereof, and the element EL2 may be a non-metal, a metalloid, or a combination thereof.

Examples of the metal may include alkaline metals (for example, lithium (Li), sodium (Na), potassium (K), rubidium (Rb), and/or cesium (Cs)); alkaline earth metals (for example, beryllium (Be), magnesium (Mg), calcium (Ca), strontium (Sr), and/or barium (Ba)); transition metals for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), and/or gold (Au)); post-transition metals (for example, zinc (Zn), indium (In), and/or tin (Sn)); and/or lanthanide metals (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and/or lutetium (Lu)).

Examples of the metalloid may include silicon (Si), antimony (Sb), and/or tellurium (Te).

Examples of the non-metal may include oxygen (O) and/or halogen (for example, F, Cl, Br, and/or I).

Examples of the element EL1 and element EL2-containing compounds may include metal oxides, metal halides (for example, metal fluoride, metal chloride, metal bromide, and/or metal iodide), metalloid halides (for example, metalloid fluoride, metalloid chloride, metalloid bromide, and/or metalloid iodide), metal tellurides, and/or one or more combinations thereof.

Examples of the metal oxides may include tungsten oxides (for example, WO, $W_2O_3$, $WO_2$, $WO_3$, and/or $W_2O_5$), vanadium oxides (for example, VO, $V_2O_3$, $VO_2$, and/or $V_2O_5$), molybdenum oxides (MoO, $Mo_2O_3$, $MoO_2$, $MoO_3$, and/or $Mo_2O_5$), and/or rhenium oxides (for example, $ReO_3$).

Examples of the metal halides may include alkali metal halides, alkaline earth metal halides, transition metal halides, post-transition metal halides, and/or lanthanide metal halides.

Examples of the alkali metal halides may include LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Examples of the alkaline earth metal halides may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Examples of the transition metal halides may include titanium halides (for example, $TiF_4$, $TiCl_4$, $TiBr_4$, and/or $TiI_4$), zirconium halides (for example, $ZrF_4$, $ZrCl_4$, $ZrBr_4$, and/or $ZrI_4$), hafnium halides (for example, $HfF_4$, $HfCl_4$, $HfBr_4$, and/or $HfI_4$), vanadium halides (for example, $VF_3$, $VCl_3$, $VBr_3$, and/or $VI_3$), niobium halides (for example, $NbF_3$, $NbCl_3$, $NbBr_3$, and/or $NbI_3$), tantalum halides (for example, $TaF_3$, $TaCl_3$, $TaBr_3$, and/or $TaI_3$), chromium halides (for example, $CrF_3$, $CrCl_3$, $CrBr_3$, and/or $CrI_3$), molybdenum halides (for example, $MoF_3$, $MoCl_3$, $MoBr_3$, and/or MoI3), tungsten halides (for example, $WF_3$, $WCl_3$, $WBr_3$, and/or $WI_3$), manganese halides (for example, $MnF_2$, $MnCl_2$, $MnBr_2$, and/or $MnI_2$), technetium halides (for example, $TcF_2$, $TcCl_2$, $TcBr_2$, and/or $TcI_2$), rhenium halides (for example, $ReF_2$, $ReCl_2$, $ReBr_2$, and/or $ReI_2$), iron halides (for example, $FeF_2$, $FeCl_2$, $FeBr_2$, and/or $FeI_2$), ruthenium halides (for example, $RuF_2$, $RuCl_2$, $RuBr_2$, and/or $RuI_2$), osmium halides (for example, $OsF_2$, $OsCl_2$, $OsBr_2$, and/or $OsI_2$), cobalt halides (for example, $CoF_2$, $CoCl_2$, $CoBr_2$, and/or $CoI_2$), rhodium halides (for example, $RhF_2$, $RhCl_2$, $RhBr_2$, and/or $RhI_2$), iridium halides (for example, $IrF_2$, $IrCl_2$, $IrBr_2$, and/or $IrI_2$), nickel halides (for example, $NiF_2$, $NiCl_2$, $NiBr_2$, and/or $NiI_2$), palladium halides (for example, $PdF_2$, $PdCl_2$, $PdBr_2$, and/or $PdI_2$), platinum halides (for example, $PtF_2$, $PtCl_2$, $PtBr_2$, and/or $PtI_2$), copper halides (for example, CuF, CuCl, CuBr, and/or CuI), silver halides (for example, AgF, AgCl, AgBr, and/or AgI), and/or gold halides (for example, AuF, AuCl, AuBr, and/or AuI).

Examples of the post-transition metal halides include zinc halides (for example, $ZnF_2$, $ZnCl_2$, $ZnBr_2$, and/or $ZnI_2$), indium halides (for example, $InI_3$), and/or tin halides (for example, $SnI_2$).

Examples of the lanthanide metal halides may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and/or $SmI_3$.

Examples of the metalloid halides may include antimony halides (for example, $SbCl_5$).

Examples of the metal tellurides may include alkali metal tellurides (for example, $Li_2Te$, $Na_2Te$, $K_2Te$, $Rb_2Te$, and/or $Cs_2Te$), alkaline earth metal tellurides (for example, BeTe, MgTe, CaTe, SrTe, and/or BaTe), transition metal tellurides (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, and/or $Au_2Te$), post-transition metal tellurides (for example, ZnTe), and/or lanthanide metal tellurides (for example, LaTe, CeTe, PrTe, NdTe, PmTe, EuTe, GdTe, TbTe, DyTe, HoTe, ErTe, TmTe, YbTe, and/or LuTe).

Emission Layer 150

The emission layer 150 may be a single quantum dot layer or a structure in which two or more quantum dot layers are stacked. For example, the emission layer 150 may be a single quantum dot layer or a structure in which two to a hundred quantum dot layers are stacked.

The emission layer 150 may include the quantum dots described in this disclosure.

The emission layer 150 may further include a dispersion medium in which the quantum dots are dispersed in a coordinated form in addition to the quantum dots as described in this disclosure. The dispersion medium may include an organic solvent, a polymer resin, or a combination thereof. As the dispersion medium, any suitable dispersion medium may be utilized as long as it is a transparent medium that does not affect (i.e., adversely affect) the optical performance of the quantum dots, is not deteriorated by light, does not reflect light, and does not cause light absorption. Examples of the organic solvent may include toluene, chloroform, ethanol, octane, or one or more combinations thereof, and examples of the polymer resin may include an epoxy resin, a silicon resin, a polystyrene resin, an acrylic resin, or one or more combinations thereof.

The emission layer 150 may be formed/prepared by applying a composition for the emission layer including quantum dots on the hole transport region 130 and volatilizing at least a part of the solvent contained in the composition for the emission layer.

For example, water, hexane, chloroform, toluene, or octane may be utilized as the solvent.

The application of the composition for the emission layer may be performed utilizing spin coating, casting, microgravure coating, gravure coating, bar coating, roll coating, wire bar coating, dip coating, spray coating, screen printing, flexographic printing, offset printing, and/or inkjet printing.

When the light-emitting element 10A is a full-color light-emitting element, the light-emitting element 10A may include emission layers that emit light of different colors for each sub-pixel.

For example, the emission layer 150 may be patterned into a first color emission layer, a second color emission layer, and a third color emission layer for each sub-pixel. At least one of the above-described emission layers may include quantum dots of an embodiment. For example, the first color emission layer may be a quantum dot emission layer including quantum dots, and each of the second color emission layer and the third color emission layer may be an organic emission layer including an organic compound. In this embodiment, the first to third colors are different colors, and light of the first to third colors may have different maximum emission wavelengths. The first to third colors may be combined with each other to make a white color (e.g., a combined white color).

As another example, the emission layer 150 may further include a fourth color emission layer. At least one of the first to fourth color emission layers is a quantum dot emission layer including quantum dots, and others (e.g., those that are not quantum dot emission layers including the quantum dots) thereof may be organic emission layers each including an organic compound. In this embodiment, the first to fourth colors are different colors, and light of the first to fourth colors may have different maximum emission wavelengths. The first to fourth colors may be combined with each other to make a white color (e.g., a combined white color).

In an embodiment, the light-emitting element 10A may have a structure in which two or more emission layers emitting light of the same or different colors are stacked to contact each other or to be spaced apart from each other (separated from each other). At least one of the two or more color emission layers is a quantum dot emission layer including quantum dots, and others thereof may be organic emission layers each including an organic compound. For example, the light-emitting element 10A may include a first color emission layer and a second color emission layer. The first color and the second color may be the same as or different from each other. For example, both (e.g., simultaneously) the first color and the second color may be blue colors.

The emission layer 150 may further include at least one selected from among an organic compound and a semiconductor compound, in addition to the quantum dots.

For example, the organic compound may include a host and a dopant. The host and the dopant may include a host and a dopant generally utilized/generally available in organic light-emitting elements.

For example, the semiconductor compound may be an organic and/or inorganic perovskite.

Electron Transport Region 170

The electron transport region 170 may have i) a single-layer structure including (e.g., consisting of) a single layer including a single material, ii) a single-layer structure including (e.g., consisting of) a single layer including materials different from each other, or iii) a multi-layer structure including (e.g., consisting of) multiple layers including different materials.

The electron transport region 170 may include at least one selected from among a buffer layer, a hole blocking layer, an electron control layer, an electron transport layer, and an electron injection layer.

For example, the electron transport region 170 may have a multi-layer structure of an electron transport layer/electron injection layer, a hole blocking layer/electron transport layer/electron injection layer, an electron control layer/electron transport layer/electron injection layer, or a buffer layer/electron transport layer/electron injection layer, which are sequentially stacked from the emission layer 150, but embodiments are not limited thereto.

The electron transport region 170 may include a conductive metal oxide. For example, the electron transport region 170 may include ZnO, $TiO_2$, $WO_3$, $SnO_2$, $In_2O_3$, $Nb_2O_5$, $Fe_2O_3$, $CeO_2$, $SrTiO_3$, $Zn_2SnO_4$, $BaSnO_3$, $In_2S_3$, ZnSiO, PC60BM, PC70BM, Mg-doped ZnO (ZnMgO), Al-doped ZnO (AZO), Ga-doped ZnO(GZO), In-doped ZnO (IZO), Al-doped $TiO_2$, Ga-doped $TiO_2$, In-doped $TiO_2$, Al-doped $WO_3$, Ga-doped $WO_3$, In-doped $WO_3$, Al-doped $SnO_2$, Ga-doped $SnO_2$, In-doped $SnO_2$, Mg-doped $In_2O_3$, Al-doped $In_2O_3$, Ga-doped $In_2O_3$, Mg-doped $Nb_2O_5$, Al-doped $Nb_2O_5$, Ga-doped $Nb_2O_5$, Mg-doped $Fe_2O_3$, Al-doped $Fe_2O_3$, Ga-doped $Fe_2O_3$, In-doped $Fe_2O_3$, Mg-doped $CeO_2$, Al-doped $CeO_2$, Ga-doped $CeO_2$, In-doped $CeO_2$, Mg-doped $SrTiO_3$, Al-doped $SrTiO_3$, Ga-doped $SrTiO_3$, In-doped $SrTiO_3$, Mg-doped $Zn_2SnO_4$, Al-doped $Zn_2SnO_4$, Ga-doped $Zn_2SnO_4$, In-doped $Zn_2SnO_4$, Mg-doped $BaSnO_3$, Al-doped $BaSnO_3$, Ga-doped $BaSnO_3$, In-doped $BaSnO_3$, Mg-doped $In_2S_3$, Al-doped $In_2S_3$, Ga-doped $In_2S_3$, In-doped $In_2S_3$, Mg-doped ZnSiO, Al-doped ZnSiO, Ga-doped ZnSiO, In-doped ZnSiO, or one or more combinations thereof.

The organic material may include a compound having electron transport properties such as BCP (2,9-Dimethyl-4,7-diphenyl-1,10-phenanthroline), Bphen(4,7-Diphenyl-1,10-phenanthroline), Alq3, BAlq, TAZ(3-(Biphenyl-4-yl)-5-(4-tert-butylphenyl)-4-phenyl-4H-1,2,4-triazole), or NTAZ.

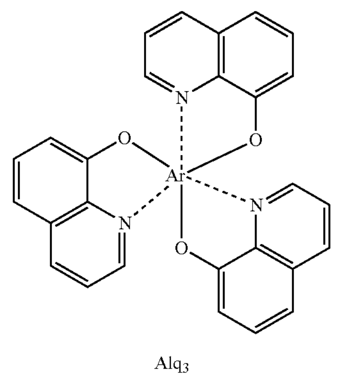

$Alq_3$

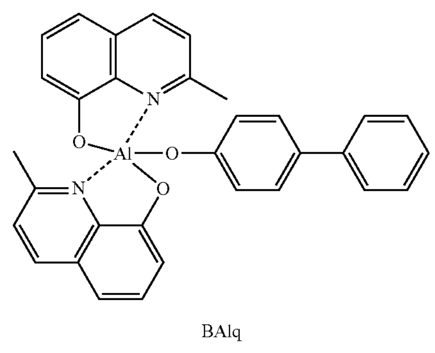

BAlq

-continued

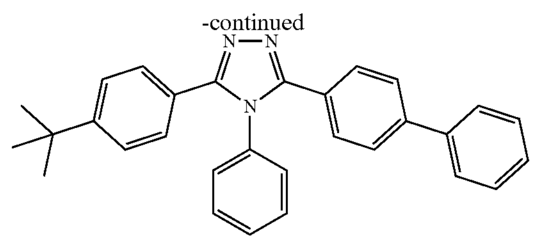

TAZ

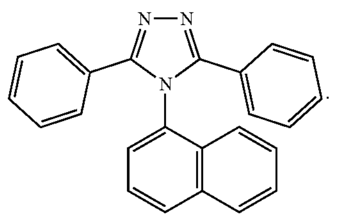

NTAZ

Further, the organic material may be a metal-free compound including a π electron-deficient nitrogen-containing $C_1$-$C_{60}$ cyclic group.

For example, the electron transport region 170 may include a compound represented by Formula 601.

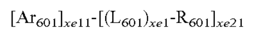

$$[Ar_{601}]_{xe11}\text{-}[(L_{601})_{xe1}\text{-}R_{601}]_{xe21} \quad \text{Formula 601}$$

In Formula 601, $Ar_{601}$ and $L_{601}$ may each independently be a $C_3$-$C_{60}$ carbocyclic group substituted or unsubstituted with at least one $R_{10a}$ or a $C_1$-$C_{60}$ heterocyclic group substituted or unsubstituted with at least one $R_{10a}$, xe11 may be 1, 2, or 3, xe may be 0, 1, 2, 3, 4, or 5, $R_{601}$ may be a $C_3$-$C_{60}$ carbocyclic group substituted or unsubstituted with at least one $R_{10a}$, a $C_1$-$C_{60}$ heterocyclic group substituted or unsubstituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, for explanations/definitions on $Q_{601}$ to $Q_{603}$, refer to the explanation/definitions on $Q_1$ in this disclosure, xe21 may be 1, 2, 3, 4, or 5, and $Ar_{601}$, $L_{601}$, and $R_{601}$ may each independently be a π electron-deficient nitrogen-containing $C_1$-$C_{60}$ cyclic group substituted or unsubstituted with at least one $R_{10a}$.

A thickness of the electron transport region 170 may be in a range of about 160 Å to about 5000 Å or, for example, about 100 Å to about 4000 Å. For example, when the electron transport region 170 includes a buffer layer, a hole blocking layer, an electron control layer, an electron transport layer, or one or more combinations thereof, a thickness of the buffer layer, the hole blocking layer, or the electron control layer may each be in a range of about 20 Å to about 1000 Å or, for example, about 30 Å to about 300 Å, and a thickness of the electron transport layer may be in a range of about 100 Å to about 1000 Å or, for example, about 150 Å to about 500 Å. When the thickness of the buffer layer, the hole blocking layer, the electron control layer, the electron transport layer, and/or the electron transport layer satisfies the above ranges, a satisfactory (suitable) degree of electron transport characteristics may be obtained without a substantial increase in driving voltage.

The electron transport region 170 (for example, an electron transport layer in the electron transport region) may further include a metal-containing material in addition to the above-described materials.

The metal-containing material may include an alkali metal complex, an alkaline earth metal complex, or a combination thereof. The metal ion of the alkali metal complex may be a Li ion, Na ion, K ion, Rb ion, or Cs ion, and/or the metal ion of the alkaline earth metal complex may be a Be ion, Mg ion, Ca ion, Sr ion, or Ba ion. Ligands coordinated to the metal ions of the alkali metal complex and alkaline earth metal complex may each independently include hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazol, hydroxyphenylpyridine, hydroxyphenylbenzoimidazole, hydroxyphenylbenzothiazole, bipyridine, phenanthroline, cyclopentadiene, or one or more combinations thereof.

For example, the metal-containing material may include a Li complex. The Li complex may include, for example, the following compound ET-D1 (LiQ) or ET-D2:

ET-D1

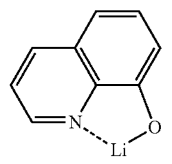

ET-D2

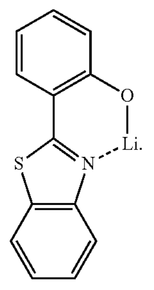

The electron transport region 170 may include an electron injection layer that facilitates the injection of electrons from the second electrode 190. The electron injection layer may directly contact the second electrode 190.

The electron injection layer may have i) a single-layer structure including (e.g., consisting of) a single layer including a single material, ii) a single-layer structure including (e.g., consisting of) a single layer including materials different from each other, or iii) a multi-layer structure including (e.g., consisting of) multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or one or more combinations thereof.

The alkali metal may include Li, Na, K, Rb, Cs, or one or more combinations thereof. The alkaline earth metal may include Mg, Ca, Sr, Ba, or one or more combinations thereof. The rare earth metal may include Sc, Y, Ce, Tb, Yb, Gd, or one or more combinations thereof.

Each of the alkali metal-containing compound, the alkaline earth metal-containing compound, and the rare earth metal-containing compound may include oxide, halide (for example, fluoride, chloride, bromide, or iodide), or telluride of each of the alkali metal, the alkali earth metal, and the rare earth metal, or one or more combinations thereof.

The alkali metal-containing compound may include an alkali metal oxide such as $Li_2O$, $Cs_2O$, or $K_2O$, an alkali metal halide such as LiF, NaF, CsF, KF, LiI, NaI, CsI, or KI, or one or more combinations thereof. The alkaline earth metal-containing compound may include an alkaline earth metal compound such as BaO, SrO, CaO, $Ba_xSr_{1-x}O$ (wherein x is a real number satisfying $0<x<1$), or $Ba_xCa_{1-x}O$ (wherein x is a real number satisfying $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or one or more combinations thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth metal complex, and the rare earth metal complex may each include i) one of the ions of alkali metal, alkaline earth metal, and rare earth metal as described above, and ii) a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzoimidazole, hydroxyphenylbenzothiazole, bipyridine, phenanthroline, cyclopentadiene, or one or more combinations thereof.

The electron injection layer may consist only of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or one or more combinations thereof, as described above, and may further include an organic material (for example, the compound represented by Formula 601).

In one embodiment, the electron injection layer may include (e.g., consist of) i) an alkali metal-containing compound (for example, an alkali metal halide), or may include (e.g., consist of) ii) a) an alkali metal-containing compound (for example, an alkali metal halide) and b) an alkali metal, an alkaline earth metal, a rare earth metal, or one or more combinations thereof. For example, the electron injection layer may be a KI:Yb co-deposition layer or an RbI:Yb co-deposition layer.

When the electron injection layer further includes an organic material, the alkali metal, alkaline earth metal, rare earth metal, alkali metal-containing compound, alkaline earth metal-containing compound, rare earth metal-containing compound, alkali metal complex, alkaline earth metal complex, rare earth metal complex, or one or more combinations thereof may be substantially uniformly or non-uniformly dispersed in a matrix including the organic material.

A thickness of the electron injection layer may be in a range of about 1 Å to about 100 Å or, for example, about 3 Å to about 90 Å. When the thickness of the electron injection layer satisfies the above-described range, satisfactory (suitable) electron injection characteristics may be obtained without a substantial increase in driving voltage.

Second Electrode 190

A second electrode 190 is on the above-described electron transport region 170. The second electrode 190 may be a cathode, which is an electron injection electrode. As a material for the second electrode 190, a metal, an alloy, an electrically conductive compound, or a combination thereof, having a low work function, may be utilized.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or one or more combinations thereof. The second electrode 190 may be a transmissive electrode, a transflective electrode, or a reflective electrode.

The second electrode 190 may have a single-layer structure or a multi-layer structure having multiple layers.

The electronic device (for example, a light-emitting device) may further include i) a color filter, ii) a color conversion layer, or iii) a color filter and a color conversion layer in addition to the light-emitting element 10A. The color filter and/or the color conversion layer may be disposed on at least one traveling direction of light emitted from the light-emitting element 10A. For example, the light emitted from the light-emitting element 10A may be blue light or white light. Description of the light-emitting element 10A is the same as described above. In one embodiment, the color conversion layer may include quantum dots. The quantum dots may be, for example, the quantum dots described in this disclosure.

The electronic device may further include a thin film transistor in addition to the above light-emitting element 10A. The thin film transistor may include a source electrode, a drain electrode, and an active layer. Either the source electrode or the drain electrode of the thin film transistor may be electrically connected to either the first electrode 110 or the second electrode 190 of the light-emitting element 10A.

The thin film transistor may further include a gate electrode and a gate insulating film.

The active layer may include crystalline silicon, amorphous silicon, organic semiconductor, or oxide semiconductor.

The electronic device may further include an encapsulation unit for encapsulating the light-emitting element 10A. The encapsulation unit may be disposed between the color filter and/or the color conversion layer and the light-emitting element 10A. The encapsulation unit allows light from the light-emitting element 10A to be extracted to the outside, and at the same time (concurrently) blocks and/or reduces the penetration of outdoor air and moisture into the light-emitting element 10A. The encapsulation unit may be an encapsulation substrate including a transparent glass substrate or plastic substrate. The encapsulation unit may be a thin film encapsulation layer including at least one organic layer and/or at least one inorganic layer. When the encapsulation unit is a thin film encapsulation layer, the electronic device may be flexible.

Various suitable functional layers may be disposed on the encapsulation unit according to the how the electronic device is utilized in addition to the color filter and/or the color conversion layer. Examples of the functional layer may include a touch screen layer, a polarizing layer, and/or an authentication device. The touch screen layer may be a pressure-sensitive touch screen layer, a capacitive touch screen layer, or an infrared touch screen layer. The authentication device may be, for example, a biometric authentication device that authenticates an individual by utilizing biometric information of a living body (for example, fingertip, pupil, etc.).

The authentication device may further include a biometric information collection unit in addition to the above-described light-emitting element 10A.

The electronic device may be applied to one or more suitable displays, an illuminator, a personal computer (for example, a mobile personal computer), a mobile phone, a digital camera, an electronic notebook, an electronic dictionary, an electronic game machine, and/or a medical device (for example, an electronic thermometer, a blood pressure monitor, a blood glucose meter, a pulse measuring device, a pulse wave measuring device, an electrocardiogram display device, an ultrasonic diagnostic device, or a display device for endoscope), a fish detector, one or more suitable measuring devices, instruments (for example, instruments for vehicles, aircrafts, ships), or a projector.

Definition of Terms

As utilized herein, the $C_3$-$C_{60}$ carbocyclic group refers to a cyclic group of 3 to 60 carbon atoms including only carbon as a ring-forming atom, and the $C_1$-$C_{60}$ heterocyclic group refers to a cyclic group of 1 to 60 carbon atoms further including a heteroatom as a ring-forming atom in addition to carbon. Each of the $C_3$-$C_{60}$ carbocyclic group and the $C_1$-$C_{60}$ heterocyclic group may be a monocyclic group having one ring or a polycyclic group in which two or more rings are condensed with each other. For example, the number of ring-forming atoms of the $C_1$-$C_{60}$ heterocyclic group may be 3 to 61.

As utilized herein, the cyclic group includes both (e.g., simultaneously) the $C_3$-$C_{60}$ carbocyclic group and the $C_1$-$C_{60}$ heterocyclic group.

As utilized herein, the π electron-rich $C_3$-$C_{60}$ cyclic group refers to a cyclic group of 3 to 60 carbon atoms not including *—N=*' as a ring-forming moiety, and the π electron-deficient nitrogen-containing $C_1$-$C_{60}$ cyclic group refers to a heterocyclic group of 1 to 60 carbon atoms including *—N=*' as a ring-forming moiety.

For example, the $C_3$-$C_{60}$ carbocyclic group may be i) group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group).

The $C_1$-$C_{60}$ heterocyclic group may be i) group T2, ii) a condensed cyclic group in which two or more groups T2 are condensed with each other, or iii) a condensed cyclic group in which one or more groups T2 and one or more groups T1 are condensed with each other (for example, a pyrrole group, thiophene group, furan group, indole group, benzoindole group, naphthoindole group, isoindole group, benzoisoindole group, naphthoisoindole group, benzosilole group, benzothiophene group, benzofuran group, Carbazole group, dibenzosilole group, dibenzothiophene group, dibenzofuran group, indenocarbazole group, indolocarbazole group, benzofurocarbazole group, benzothienocarbazole group, benzosilolocarbazole group, benzoindolocarbazole group, benzocarbazole group, benzonaphthofuran group, benzonaphthothiophene group, benzonaphthosilole group, benzofurodibenzofuran group, benzofurodibenzothiophene group, benzothienodibenzothiophene group, pyrazole group, imidazole group, triazole group, oxazole group, isoxazole group, oxadiazole group, thiazole group, isothiazole group, thiadiazole group, benzopyrazole group, benzimidazole group, benzoxazole group, benzoisoxazole group, benzothiazole group, benzoisothiazole group, pyridine group, pyrimidine group, pyrazine group, pyridazine group, triazine group, quinoline group, isoquinoline group, benzoquinoline group, benzoisoquinoline group, quinoxaline group, benzoquinoxaline group, quinazoline group, benzoquinazoline group, phenanthroline group, sinoline group, phthalazine group, naphthyridine group, imidazopyridine group, imidazopyrimidine group, imidazotriazine group, imidazopyrazine group, imidazopyridazine group, azacarbazole group, azafluorene group, azadibenzosilol group, azadibenzothiophene group, or azadibenzofuran group).

The π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which one or more groups T3 and one or more groups T1 are condensed with each other (for example, the $C_3$-$C_{60}$ carbocyclic group, a 1 H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group).

The π electron-deficient nitrogen-containing $C_1$-$C_{60}$ cyclic group may be i) group T4, ii) a condensed cyclic group in which two or more groups T4 are condensed with each other, iii) a condensed cyclic group in which one or more groups T4 and one or more groups T1 are condensed with each other, iv) a condensed cyclic group in which one or more groups T4 and one or more groups T3 are condensed with each other, or v) a condensed cyclic group in which one or more groups T4, one or more groups T1, and one or more groups T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a sinoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilol group, an azadibenzothiophene group, or an azadibenzofuran group.

The group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, or a norbornane group (or a bicyclo[2.2.1]heptane group, a bicyclo[1.1.1]pentane group, a bicyclo[2.1.1]hexane group, a bicyclo[2.2.2]octane group, or a benzene group).

The group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, or a piperidine group.

The group T3 may be a furan group, a thiophene group, a 1H-pyrrole group, a silole group, or a borole group.

The group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

As utilized herein, the term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" may be a group condensed into an arbitrary cyclic group, a monovalent group, or a multivalent group (for example, bivalent group, trivalent group, or tetravalent group) depending on the structure of the chemical formula in which the term is utilized. For example, the "benzene group" may be a benzo group, a phenyl group, or a phenylene group, which may be understood by those skilled in the art, depending on the structure of the chemical formula including the "benzene group".

For example, examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and/or a monovalent non-aromatic heterocondensed polycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a substituted or unsubstituted divalent non-aromatic hetero condensed polycyclic group.

As utilized herein, the $C_1$-$C_{60}$ alkyl group refers to a linear or branched aliphatic hydrocarbon monovalent group of 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and/or a tert-decyl group. As utilized herein, the $C_1$-$C_{60}$ alkylene group refers to a divalent group having the same structure as the $C_1$-$C_{60}$ alkyl group.

As utilized herein, the $C_2$-$C_{60}$ alkenyl group refers to a monovalent hydrocarbon group containing one or more carbon-carbon double bonds in the middle (not in the end/terminus) or end/terminus of a $C_2$-$C_{60}$ alkyl group, and examples thereof may include an ethenyl group, a prophenyl group, and/or a butenyl group. As utilized herein, the $C_2$-$C_{60}$ alkenylene group refers to a divalent group having the same structure as the $C_2$-$C_{60}$ alkenyl group.

As utilized herein, the $C_2$-$C_{60}$ alkynyl group refers to a monovalent hydrocarbon group containing one or more carbon-carbon triple bonds in the middle (not in the end/terminus) or end/terminus of the $C_2$-$C_{60}$ alkyl group, and examples thereof may include an ethynyl group and/or a propynyl group. As utilized herein, the $C_2$-$C_{60}$ alkynylene group refers to a divalent group having the same structure as the $C_2$-$C_{60}$ alkynyl group.

As utilized herein, the $C_1$-$C_{60}$ alkoxy group refers to a monovalent group having the formula $—OA_{101}$ (here, $A_{101}$ is the above-described $C_1$-$C_{60}$ alkyl group), and examples thereof include a methoxy group, an ethoxy group, and/or an isopropyloxy group.

As utilized herein, the $C_3$-$C_{10}$ cycloalkyl group refers to a monovalent saturated hydrocarbon cyclic group of 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, and a norbornanyl group (or a bicyclo[2.2.1]heptyl group, a bicyclo[1.1.1]pentyl group, a bicyclo[2.1.1]hexyl group, and/or a bicyclo[2.2.2]octyl group). As utilized herein, the $C_3$-$C_{10}$ cycloalkylene group refers to a divalent group having the same structure as the $C_3$-$C_{10}$ cycloalkyl group.

As utilized herein, the $C_1$-$C_{10}$ heterocycloalkyl group refers to a monocyclic group of 1 to 10 carbon atoms further including at least one heteroatom as a ring-forming atom in addition to carbon atom, and examples thereof may include a 1,2,3,4-oxatriazolidinyl group, a tetrahydrofuranyl group, and/or a tetrahydrothiophenyl group. As utilized herein, the $C_1$-$C_{10}$ heterocycloalkylene group refers to a divalent group having the same structure as the $C_1$-$C_{10}$ heterocycloalkyl group.

As utilized herein, the $C_3$-$C_{10}$ cycloalkenyl group is a monovalent cyclic group of 3 to 10 carbon atoms, and refers to a group having at least one carbon-carbon double bond in the ring, but not having aromaticity, and examples thereof may include a cyclopentenyl group, a cyclohexenyl group, and/or a cycloheptenyl group. As utilized herein, the $C_3$-$C_{10}$ cycloalkenylene group refers to a divalent group having the same structure as the $C_3$-$C_{10}$ cycloalkenyl group.

As utilized herein, the $C_1$-$C_{10}$ heterocycloalkenyl group is a monovalent cyclic group of 1 to 10 carbon atoms further containing at least one heteroatom as a ring-forming atom in addition to carbon atoms, and has at least one double bond in the ring thereof. Examples of the $C_1$-$C_{10}$ heterocycloalkenyl group may include a 4,5-dihydro-1,2,3,4-oxatriazolyl group, a 2,3-dihydrofuranyl group, and/or a 2,3-dihydrothiophenyl group. As utilized herein, the $C_1$-$C_{10}$ heterocycloalkenylene group refers to a divalent group having the same structure as the $C_1$-$C_{10}$ heterocycloalkenyl group.

As utilized herein, the $C_6$-$C_{60}$ aryl group refers to a monovalent group having a carbocyclic aromatic system of 6 to 60 carbon atoms, and the $C_6$-$C_{60}$ arylene group refers to a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a pisenyl group, a hexaenyl group, a pentacenyl group, a rubicenyl group, a coronenyl group, and/or an ovalenyl group. When the $C_6$-$C_{60}$ aryl group and the $C_6$-$C_{60}$ arylene group include two or more rings, the two or more rings may be condensed with each other.

As utilized herein, the $C_1$-$C_{60}$ heteroaryl group refers to a monovalent group further containing at least one heteroatom as a ring-forming atom in addition to carbon atom and having a heterocyclic aromatic system of 1 to 60 carbon atoms, and the $C_1$-$C_{60}$ heteroarylene group refers to a divalent group further containing at least one heteroatom as a ring-forming atom in addition to carbon atoms and having a heterocyclic aromatic system of 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a sinolinyl group, a phenanthrolinyl group, a phthalazinyl group, and/or a naphthyridinyl group. When the $C_1$-$C_{60}$ heteroaryl group and the $C_1$-$C_{60}$ heteroarylene group contain two or more rings, the two or more rings may be condensed with each other.

As utilized herein, the monovalent non-aromatic condensed polycyclic group is a monovalent group (for example, having 8 to 60 carbon atoms) in which two or more rings are condensed with each other, which contains only carbon as a ring-forming atom, and in which the entire molecule has non-aromaticity. Examples of the monovalent non-aromatic condensed polycyclic group may include an indenyl group, a fluorenyl group, a spiro-bifluorenyl group, a benzofluorenyl group, an indenophenanthrenyl group, and/or an indenoanthracenyl group. As utilized herein, the divalent non-aromatic condensed polycyclic group refers to a divalent group having the same structure as the monovalent non-aromatic condensed polycyclic group.

As utilized herein, the monovalent non-aromatic condensed heteropolycyclic group is a monovalent group (for example, having 8 to 60 carbon atoms) in which two or more rings are condensed with each other, which contains at least one heteroatom as a ring-forming atom in addition to carbon atom, and in which the entire molecule has non-aromaticity. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl, a triazolyl, a tetrazolyl group, an oxazolyl group, an isoxazolyl group, a thiazolyl group, an isothiazolyl group, an oxadiazolyl group, a thiadiazolyl group, a benzopyrazolyl group, a benzoimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and/or a benzothienodibenzothiophenyl group. As utilized herein, the divalent non-aromatic condensed heteropolycyclic group refers to a divalent group having the same structure as the monovalent non-aromatic condensed heteropolycyclic group.

As utilized herein, the $C_6$-$C_{60}$ aryloxy group indicates $-OA_{102}$ (wherein $A_{102}$ is the above-described $C_6$-$C_{60}$ aryl group), and the $C_6$-$C_{60}$ arylthio group indicates $-SA_{103}$ (wherein $A_{103}$ is the above-described $C_6$-$C_{60}$ aryl group).

As utilized herein, the $C_7$-$C_{60}$ arylalkyl group indicates $-A_{104}A_{105}$ (wherein $A_{104}$ is a $C_1$-$C_{54}$ aryl group, and $A_{105}$ is a $C_6$-$C_{59}$ aryl group), and the $C_2$-$C_{60}$ heteroarylalkyl group indicates $-A_{106}A_{107}$ (wherein $A_{106}$ is a $C_1$-$C_{59}$ alkylene group, and $A_{107}$ is a $C_1$-$C_{59}$ heteroaryl group).

As utilized herein, "$R_{10a}$" may be deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted or unsubstituted with deuterium (-D), —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or one or more combinations thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each substituted or unsubstituted with deuterium (-D), —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $-Si(Q_{21})(Q_{22})(Q_{23})$, $-N(Q_{21})(Q_{22})$, $-B(Q_{21})(Q_{22})$, $-C(=O)(Q_{21})$, $-S(=O)_2(Q_{21})$, $-P(=O)(Q_{21})(Q_{22})$, or one or more combinations thereof; or $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$.

As utilized herein, $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group;

a $C_2$-$C_{60}$ alkynyl group; a $C_3$-$C_{60}$ carbocyclic group or a $C_1$-$C_{60}$ heterocyclic group, each substituted or unsubstituted with deuterium, —F, a cyano group, a $C_1$-$C_{60}$ alkyl group, a $C_1$-$C_{60}$ alkoxy group, a phenyl group, a biphenyl group, or one or more combinations thereof; a $C_7$-$C_{60}$ arylalkyl group; or a $C_2$-$C_{60}$ heteroarylalkyl group.

As utilized herein, the heteroatom refers to any atom except for carbon atom. The heteroatom includes O, S, N, P, Si, B, Ge, Se, or one or more combinations thereof.

As utilized herein, the third-row transition metal includes hafnium (Hf), tantalum (Ta), tungsten (W), rhenium (Re), osmium (Os), iridium (Ir), platinum (Pt), and/or gold (Au).

As utilized herein, the "Ph" refers to a phenyl group, "Me" refers to a methyl group, the "Et" refers to an ethyl group, the "ter-Bu" or "$Bu^t$" refers to a tert-butyl group, and the "OMe" refers to a methoxy group.

As utilized herein, the "biphenyl group" refers to a "phenyl group substituted with a phenyl group". The "biphenyl group" belongs to a "substituted phenyl group" in which the substituent is a "$C_6$-$C_{60}$ aryl group".

As utilized herein, the "terphenyl group" refers to "phenyl group substituted with biphenyl group". The "terphenyl group" belongs to a "substituted phenyl group" in which the substituent is a "$C_6$-$C_{60}$ aryl group substituted with a $C_6$-$C_{60}$ aryl group".

As utilized herein, unless otherwise defined, *and *' each refer to a bonding site of a chemical formula or moiety with a neighboring atom.

Hereinafter, the method of preparing a quantum dot according to an embodiment, and the quantum dot prepared utilizing the method will be described in more detail with reference the following Examples.

EXAMPLE

Example 1

0.6 mmol of zinc acetate, 0.7 mL of oleic acid (OA), and 5 mL of 1-octadecene (ODE) were mixed in a 3-neck flask to synthesize ZnSeTe core. After maintaining a vacuum atmosphere at 120° C. for about 30 minutes, the atmosphere was changed to $N_2$, and the temperature was increased to 210° C. When the temperature reached 210° C., 0.15 mL of 2 M Se-DPP (diphenylphosphine) and 0.23 mL of 0.047 M Te-TOP (trioctylphosphine) prepared in advance were injected, and the mixture was allowed to react for 30 minutes. Then, the temperature was increased to 300° C., the mixture was allowed to react for additional 1 hour to synthesize a ZnSeTe core. In order to form a thin ZnSe protective shell on a surface of the ZnSeTe core, 1 mL of 1 M zinc oleate and 0.33 mL of 1.2 M Se-TOP were injected to the mixture, and the mixture was allowed to react at 300° C. for 1 hour. The synthesis solution after completion of the reaction was cooled to room temperature, and ethanol was added thereto to perform purification. The ZnSeTe/thin-ZnSe quantum dots after completion of the purification were stored as dispersed in hexane.

In order to form a first shell from the protective shell, 3 mmol of zinc acetate, 2 mL of OA, and 10 mL of TOA (trioctylamine) were prepared in a 3-neck flask. After maintaining a vacuum atmosphere at 120° C. for about 30 minutes, the atmosphere was changed to $N_2$, and the ZnSeTe/thin-ZnSe quantum dots dispersed in hexane were injected to the resultant (product that was formed). HF was injected to the resultant to remove an oxide film, and the temperature was increased to 340° C. After injecting 4 mL of 0.5 M of zinc oleate and 0.6 mL of 2 M of Se-TOP, the resultant was allowed to react for 30 minutes to form a first shell (ZnSe) from the protective shell (thin-ZnSe). Next, in order to form a ZnS shell, 3 mL of 0.5 M of zinc oleate and 1.2 mL of 2 M of S-TOP were injected, and the reaction was maintained for 30 minutes. The solution after completion of the reaction was cooled to room temperature, ethanol was added thereto for purification, and then ZnSeTe/ZnSe/ZnS quantum dots thus prepared were dispersed in hexane.

Example 2 and Comparative Examples 1 to 4

Quantum dots were prepared in substantially the same manner as in Example 1, except that the type or kind of the shell, application of the protective shell, and HF treatment were changed according to Table 1.

Evaluation Example 1: Light-Emitting Characteristic Evaluation

Light-emitting characteristics of the quantum dots prepared in Examples 1 and 2 and Comparative Examples 1 to 4 were measured utilizing QE-2100 (available from Otsuka Electronics Co., Ltd). The results of the measurement are shown in Table 1. Also, a photoluminescent (PL) spectrum of the quantum dots prepared in Example 1 was measured. The results of the measurement are shown in FIG. 4.

Evaluation Example 2: TEM Evaluation

Figure 5:
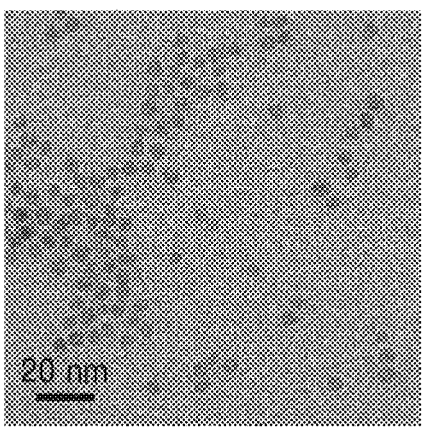
FIG. 5 shows transmission electron microscopy (TEM) images of quantum dots prepared in Example 1 and Comparative Examples 1 and 2 according to one or more embodiments of the present disclosure.
Figure 5:
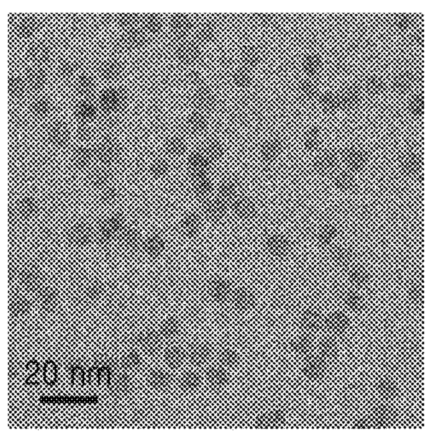
Figure 5:
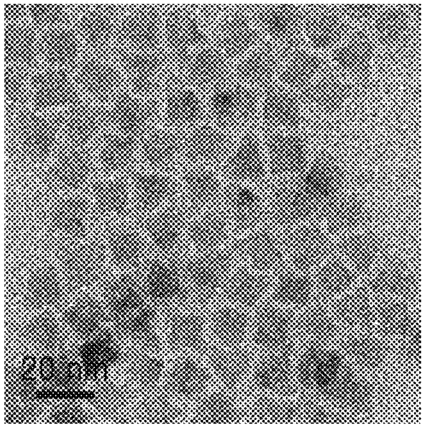

Transmission electron microscopic (TEM) images of the quantum dots prepared in Example 1 and Comparative Examples 1 and 2 were taken. The taken images are shown in FIG. 5.

TABLE 1

| | Type of core | Type of shell | Application of protective shell | HF treatment | Maximum emission wavelength (nm) | Full width at half maximum (FWHM) | Quantum efficiency (%) |
|---|---|---|---|---|---|---|---|
| Example 1 | ZnSeTe | ZnSe/ZnS | Applied | Treated | 458 | 28 | 77 |
| Example 2 | ZnSeTe | ZnSe/ZnS | Applied | Not treated | 458 | 26 | 57 |
| Comparative Example 1 | ZnSeTe | — | — | Not treated | 440 | 61 | 4 |
| Comparative Example 2 | ZnSeTe | ZnSe protective shell* | — | Not treated | 453 | 40 | 24 |
| Comparative Example 3 | ZnSeTe | ZnSe/ZnS | Not applied | Not treated | 456 | 24 | 20 |

TABLE 1-continued

| | Type of core | Type of shell | Application of protective shell | HF treatment | Maximum emission wavelength (nm) | Full width at half maximum (FWHM) | Quantum efficiencty (%) |
|---|---|---|---|---|---|---|---|
| Comparative Example 4 | ZnSeTe | ZnSe/ZnS | Not applied | Treated | 458 | 26 | 45 |

*indicates the embodiment only having the ZnSe protective shell and not forming the first shell by increasing a thickness of the protective shell.

Referring to FIG. 4, it was confirmed that the quantum dots prepared in Example 1 by forming the first shell from the protective shell after forming the protective shell had a maximum emission wavelength at 458 nm and a FWHM of 28 nm.

Referring to FIG. 5, it was confirmed that as compared to the quantum dots of Comparative Example 1 only including a core and the quantum dot of Comparative Example 2 including a core and a protective shell, the quantum dots of Example 1 having the first shell (ZnSe) formed from the protective shell (thin-ZnSe) had an increase in thickness of the shell, which increased the average particle diameter of the quantum dots.

Referring to Table 1, it was confirmed that as compared to the quantum dots of Comparative Examples 1 to 4 not having the protective shell or having only the protective shell, the quantum dots of Examples 1 and 2 having the first shell formed from the protective shell had reduced FWHMs and improved quantum yields.

Also, it was confirmed that as compared to the quantum dots of Example 2 not treated with HF, the quantum dots of Example 1 from which the oxide film was removed during the purifying process of the first particle by treating with HF had an improved quantum yield.

When the quantum dot prepared utilizing the method of preparing a quantum dot includes a protective shell, oxidation of a core may be prevented or reduced, and the quantum dot having a relatively thick first shell may be easily prepared. In this regard, a FWHM of light emitted to the quantum dot may be reduced, and a quantum yield of the quantum dot may be improved. Also, when the quantum dot is utilized, an optical member or an electronic device of high quality may be provided.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The electronic device or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

In the present disclosure, when particles are spherical, "diameter" indicates an average particle diameter, and when the particles are non-spherical, the "diameter" indicates a major axis length. The diameter (or size) of the particles may be measured utilizing a scanning electron microscope or a particle size analyzer. As the particle size analyzer, for example, HORIBA, LA-950 laser particle size analyzer, may be utilized. When the size of the particles is measured utilizing a particle size analyzer, the average particle diameter (or size) is referred to as D50. D50 refers to the average diameter (or size) of particles whose cumulative volume corresponds to 50 vol % in the particle size distribution (e.g., cumulative distribution), and refers to the value of the particle size corresponding to 50% from the smallest particle when the total number of particles is 100% in the distribution curve accumulated in the order of the smallest particle size to the largest particle size.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A method of preparing a quantum dot, the method comprising:

forming a first particle comprising a core and a protective shell from a quantum dot composition comprising
a precursor containing a tellurium (Te) element,
a precursor containing a Group II element, and
a precursor containing a Group VI element;

purifying the first particle, the purifying comprising removing an oxide film formed on a surface of the first particle; and forming a second particle comprising a first shell by mixing the first particle with a first shell composition comprising
the precursor containing a Group II element and
the precursor containing a Group VI element and
forming the first shell from the protective shell,
wherein the core and the protective shell each independently comprises a Group II-VI compound.

2. The method of claim 1, wherein a reaction temperature of the forming of the first particle is in a range of about 100° C. to about 400° C.

3. The method of claim 1, wherein the forming of the first particle comprises:

forming of a core comprising a tellurium (Te) element; and forming a protective shell not comprising any tellurium (Te) element.

4. The method of claim 3, wherein the forming of the protective shell not comprising any tellurium (Te) element comprises further adding the precursor containing a Group II element and the precursor containing a Group VI element to the quantum dot composition.

5. The method of claim 1, wherein the quantum dot composition comprises a first solvent having a boiling point of about 350° C. or lower.

6. The method of claim 1, wherein a thickness of the protective shell is in a range of about 0.3 nm to about 1 nm.

7. The method of claim 1, wherein a radius of the core is in a range of about 0.1 nm to about 3.5 nm.

8. The method of claim 1, wherein the purifying of the first particle comprises removing an unreacted quantum dot composition.

9. The method of claim 8, wherein the removing of the oxide film further comprises treating the first particle with an oxide film removing agent, and removing the oxide film formed on the surface of the first particle.

10. The method of claim 1, wherein the forming of the second particle is performed at a temperature higher than a temperature of the forming of the first particle.

11. The method of claim 1, wherein a reaction temperature of the forming of the second particle is in a range of about 200° C. to about 500° C.

12. The method of claim 1, wherein a thickness of the first shell is in a range of about 1.5 nm to about 3.5 nm.

13. The method of claim 1, wherein the first shell composition comprises a second solvent having a boiling point of about 350° C. or higher.

14. The method of claim 1, further comprising forming a second shell by mixing the second particle with a second shell composition comprising a precursor containing a Group II element and a precursor containing a Group VI element.

15. The method of claim 1, wherein an emission wavelength of the quantum dot is in a range of about 400 nm to about 490 nm.

16. An optical member comprising the quantum dot of claim 1.

17. An electronic device comprising the quantum dot of claim 1.

18. The electronic device of claim 17, further comprising:

a light source, the light source being configured to emit a path of light; and a color conversion member arranged in the path of light, wherein the color conversion member comprises the quantum dot.

19. The electronic device of claim 17, further comprising a light-emitting element comprising:

a first electrode;

a second electrode facing the first electrode; and an emission layer between the first electrode and the second electrode, wherein the light-emitting element comprises the quantum dot.

20. The method of claim 8, wherein the purifying of the first particle further comprises treating the first particle with an oxide film removing agent comprising HF after removing the unreacted quantum dot composition, and removing the oxide film formed on the surface of the first particle.

* * * * *